(12) United States Patent
Bernard et al.

(10) Patent No.: US 6,445,236 B1
(45) Date of Patent: Sep. 3, 2002

(54) MASTER-SLAVE FLIP-FLOP CIRCUIT WITH EMBEDDED HOLD FUNCTION AND METHOD FOR HOLDING DATA IN A MASTER-SLAVE FLIP-FLOP CIRCUIT

(75) Inventors: Jennifer Michelle Bernard, Pflugerville; Christopher M. Durham, Round Rock; Peter Juergen Klim; Donald Mikan, Jr., both of Austin, all of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/931,306

(22) Filed: Aug. 16, 2001

(51) Int. Cl.[7] .............................................. H03K 3/289
(52) U.S. Cl. ...................................... 327/202; 327/199
(58) Field of Search ................................ 327/202, 199, 327/216–218, 24

(56) References Cited

U.S. PATENT DOCUMENTS

| | | | | |
|---|---|---|---|---|
| 5,784,384 A | * | 7/1998 | Maeno | 714/726 |
| 6,081,153 A | * | 6/2000 | Hamada et al. | 327/202 |
| 6,198,324 B1 | * | 3/2001 | Schober et al. | 327/202 |
| 6,333,959 B1 | * | 12/2001 | Lai et al. | 377/69 |

* cited by examiner

Primary Examiner—Kenneth B. Wells
Assistant Examiner—Cassandra Cox
(74) Attorney, Agent, or Firm—Casimer K. Salys, Esq.; Russell D. Culbertson, Esq.; Shaffer & Culbertson, LLP

(57) ABSTRACT

A master-slave flip-flop circuit (200, 200') includes a master latch circuit (202) and slave latch circuit (203). A hold control component (220) included in the master latch circuit (202) is interposed between a master latch node (ML) and a slave input node (SI). The hold control component blocks the transfer of data from the master latch node (ML) to the slave input node (SI) in response to a hold input. In the preferred form of the invention of the hold control component (220) comprises a tri-state inverter having an input connected to the master latch node (ML) and an output connected to the slave input node (SI). The hold input, comprising a high level hold signal and its complementary or inverted signal, disables the tri-state inverter and thus prevent data from being transferred from the master latch node (ML) to the slave input node (SI). When the hold input is removed, that is, when the hold signal is at a low logical level and complementary signal is at a high logical level, the master-slave flip-flop circuit (200, 200') operates in the normal fashion, receiving and latching new data in each clock cycle and applying that new data to the circuit output.

20 Claims, 4 Drawing Sheets

MASTER-SLAVE FLIP-FLOP CIRCUIT WITH EMBEDDED HOLD FUNCTION AND METHOD FOR HOLDING DATA IN A MASTER-SLAVE FLIP-FLOP CIRCUIT

TECHNICAL FIELD OF THE INVENTION

This invention relates to the electronic circuits known as master-slave flip-flop circuits. More particularly, the invention relates to a master-slave flip-flop circuit incorporating a hold function without substantially increasing the propagation delay through the circuit. The invention also encompasses a method for holding data in a master-slave flip-flop circuit.

BACKGROUND OF THE INVENTION

A master-slave flip-flop circuit is an essential building block in microprocessor design. FIG. 1 shows a prior art master-slave flip-flop circuit 100 which includes a master latch circuit 102 and a slave latch circuit 103. These two latch circuits operate on the same clock inputs, the signal "CLK" and its complementary or inverted signal "_CLK."

Master latch circuit 102 includes a master input transmission gate 104, a master output inverter 105, and a master feedback circuit 106. Master input transmission gate 104 is connected between a master input node 110 and a master latch node 111, and is controlled by the clock signals CLK and _CLK. Master output inverter 105 is connected between master latch node 111 and an input to the slave latch circuit, slave input node 114. Feedback circuit 106 is connected to selectively apply feedback to the master latch node 111 under the control of the clock signals CLK and _CLK.

Slave latch circuit 103 comprises a latch circuit identical to master latch circuit 102, including a slave input transmission gate 124, a slave output inverter 125, and a slave feedback circuit 126. Slave input transmission gate 124 is connected between the slave input node 114 and a slave latch node 131, while slave output inverter 125 is connected between the slave latch node and a slave output which provides the output Q from master-slave flip-flop circuit 100. Slave feedback circuit 126 is connected to selectively apply feedback to slave latch node 131 under the control of the clock signals CLK and _CLK.

It will be noted by comparing the clock signals to the two latch circuits that the clock signals applied to slave latch circuit 103 are reversed with respect to the clock signals applied to master latch circuit 102. As the clock signal CLK goes high, master input transmission gate 104 is enabled so that master latch circuit 102 receives the data appearing at master input node 110, while slave input transmission gate 124 is disabled and slave latch circuit 103 stores data received on the previous clock half cycle. This data latched at slave latch circuit 103 is inverted by slave output inverter 125 to restore the polarity of the data and provide the circuit output Q. When the clock signal CLK goes low in the second half of the clock cycle, the states of master latch circuit 102 and slave latch circuit 103 are reversed. That is, when CLK goes low, master input transmission gate 104 is disabled and master latch circuit 102 stores the data which has been passed to the master latch circuit in the previous half clock cycle. At the same time, the low clock signal CLK and corresponding high signal _CLK enable slave input transmission gate 124 to pass the output from master latch circuit 102 to slave latch node 131.

Thus, in the first half of each clock cycle, input data is applied to master latch circuit 102 while slave latch circuit 103 stores data received from the master latch circuit in the last half of the previous clock cycle. In the second half of each clock cycle, master latch circuit 102 stores the data received in the first half cycle and slave latch circuit 103 to receives the output from the master latch circuit.

In many applications it is necessary to hold data at the output of a master-slave flip-flop circuit or control when new data is latched by the circuit. The prior art circuit shown in FIG. 1 shows hold circuit 140 added to master-slave flip-flop circuit 100 to facilitate this control over the operation of the master-slave flip-flop circuit. Hold circuit 140 comprises a multiplexer interposed between master input node 110 and a data input node which receives data D. The hold multiplexer 140 is implemented with two static AND gates 142 and 143, and a static NOR gate 144 with an inverter 145 to restore the polarity of the data D. A hold input comprising the signal "HOLD" and its complement "_HOLD" is used to control the two AND gates 142 and 143. When the HOLD signal is at a high logical state, and thus the _HOLD signal is at a low logical state, the data D is blocked at AND gate 142, and AND gate 143 passes a feedback signal derived from the master latch node 111. Thus, as long as the HOLD signal is high, the master latch circuit 102 cannot receive new data and simply holds data received in the clock cycle before the HOLD signal went to a high logical level. This data received in a previously clock cycle is also held latched at slave latch circuit 103 to maintain the previous data output at Q.

The hold capability in the prior art circuit shown in FIG. 1 is obtained at the cost of greatly increasing the propagation delay through the circuit. That is, since the hold multiplexer 140 is inserted in the data propagation path through the circuit, the multiplexer circuitry more than doubles the delay through the circuit as compared to the master-slave to flip-flop circuit without the hold multiplexer. Thus, the prior art hold arrangement shown in FIG. 1 incurs a severe performance penalty.

SUMMARY OF THE INVENTION

It is an object of the invention to provide a master-slave flip-flop circuit having the ability to selectively hold data while avoiding the performance penalty incurred in prior master-slave flip-flop circuits with hold capability. Another object of the invention is to provide a method of holding data in a master-slave flip-flop circuit without incurring a performance penalty.

A master-slave flip-flop circuit according to the invention utilizes a similar master and slave latch circuit arrangement to the circuit 100 shown in FIG. 1, but includes a hold control component interposed between the master latch node and slave input node. This hold control component blocks the transfer of data from the master latch node to the slave input node in response to a hold input. In the preferred form of the invention, the hold control component comprises a tri-state inverter having an input connected to the master latch node and an output connected to the slave input node. The hold input, comprising a high level hold signal and its complementary or inverted signal, controls the operation of the tri-state inverter to selectively disable the device from applying data to the slave input node from the master latch node. When the hold input is removed, that is, when the hold signal is at a low logical level and the complementary signal is at a high logical level, the master-slave flip-flop circuit operates in the normal fashion, receiving and latching new data in each clock cycle and applying that new data to the circuit output.

In an alternate form of the invention, the slave latch circuit includes a hold feedback component connected between a slave feedback node of the slave latch circuit and the slave input node. This hold feedback component applies a feedback signal to the slave input node in response to the hold input to help maintain the desired charge state at the slave input node while the hold input is asserted. The preferred hold feedback component comprises a tri-state inverter having an inverter input connected to the slave feedback node and an output connected to the slave input node. In this form of the invention, the same high level hold signal and complementary signal used to disable the hold control component are also used to enable the tri-state inverter to apply the desired feedback. However, in the absence of the hold input, that is, when the hold signal is at a logical low level and its complementary signal is at a logical high level, the tri-state inverter is disabled to block the feedback signal to the slave input node.

The method of holding data in a master-slave flip-flop circuit according to the invention includes applying data from a master latch node to the input of the slave latch circuit and then latching the data in a first clock cycle. The method then includes applying a hold input to isolate the slave input node from the master latch node in the following clock cycle. With the slave input node isolated from the master latch node in this hold condition, the slave latch circuit maintains the previously stored data without regard to the data applied to the master latch circuit of the master-slave flip-flop circuit.

The master-slave flip-flop circuit according to the present invention incorporates the hold capability without incurring any substantial performance penalty. Unlike the prior art circuit shown in FIG. 1, the hold capability in the present circuit is achieved with control elements embedded in the normal master-slave flip-flop circuitry, and without adding a muliplexing arrangement in the data propagation path. The embedded hold control elements according to the invention have no significant impact on the propagation delay through the master-slave flip-flop circuit.

These and other objects, advantages, and features of the invention will be apparent from the following description of the preferred embodiments, considered along with the accompanying drawings.

DESCRIPTION OF THE PREFERRED EMBODIMENTS

Figure 1:
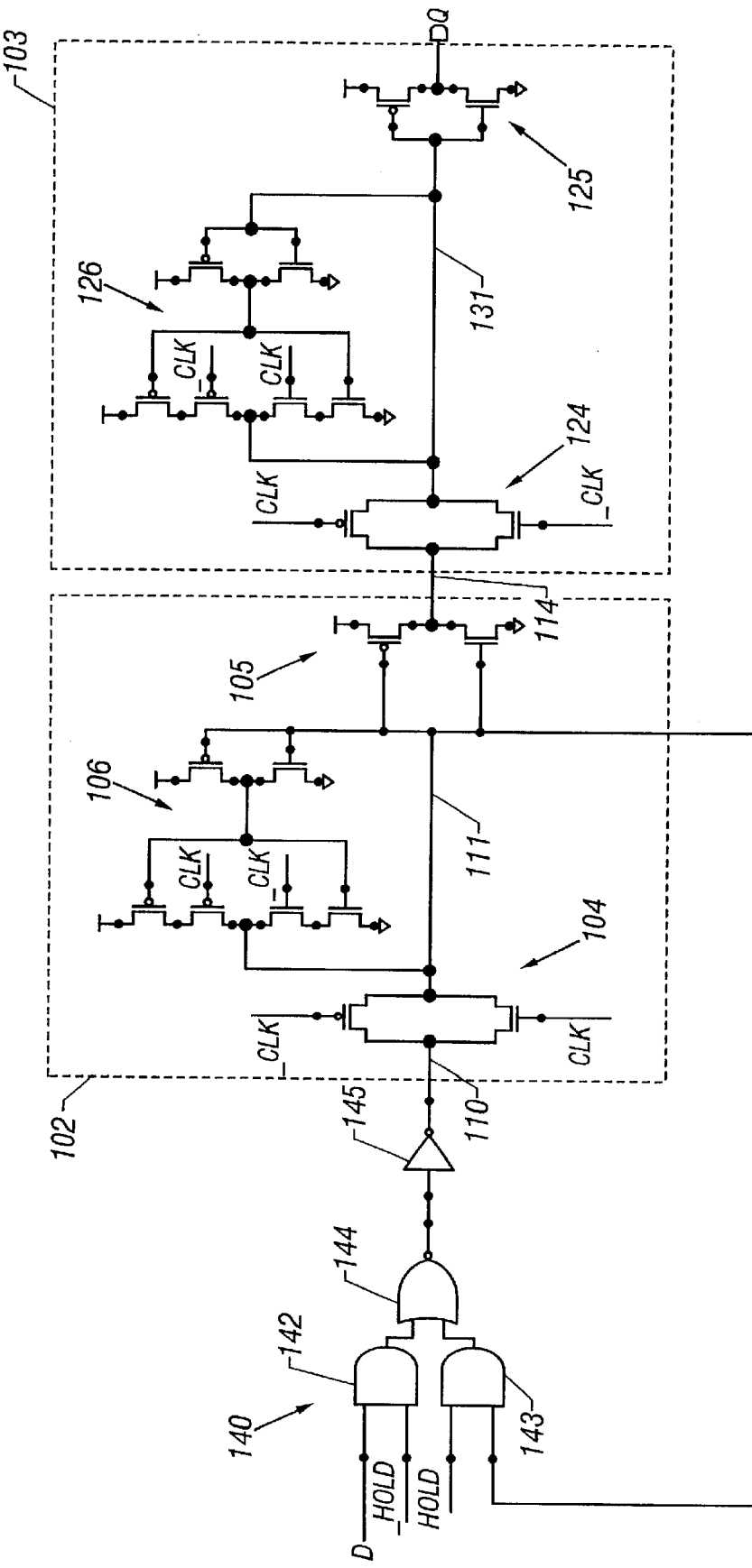
FIG. 1 is an electrical schematic diagram showing a prior art master-slave flip-flop circuit with hold capability.
Figure 2:
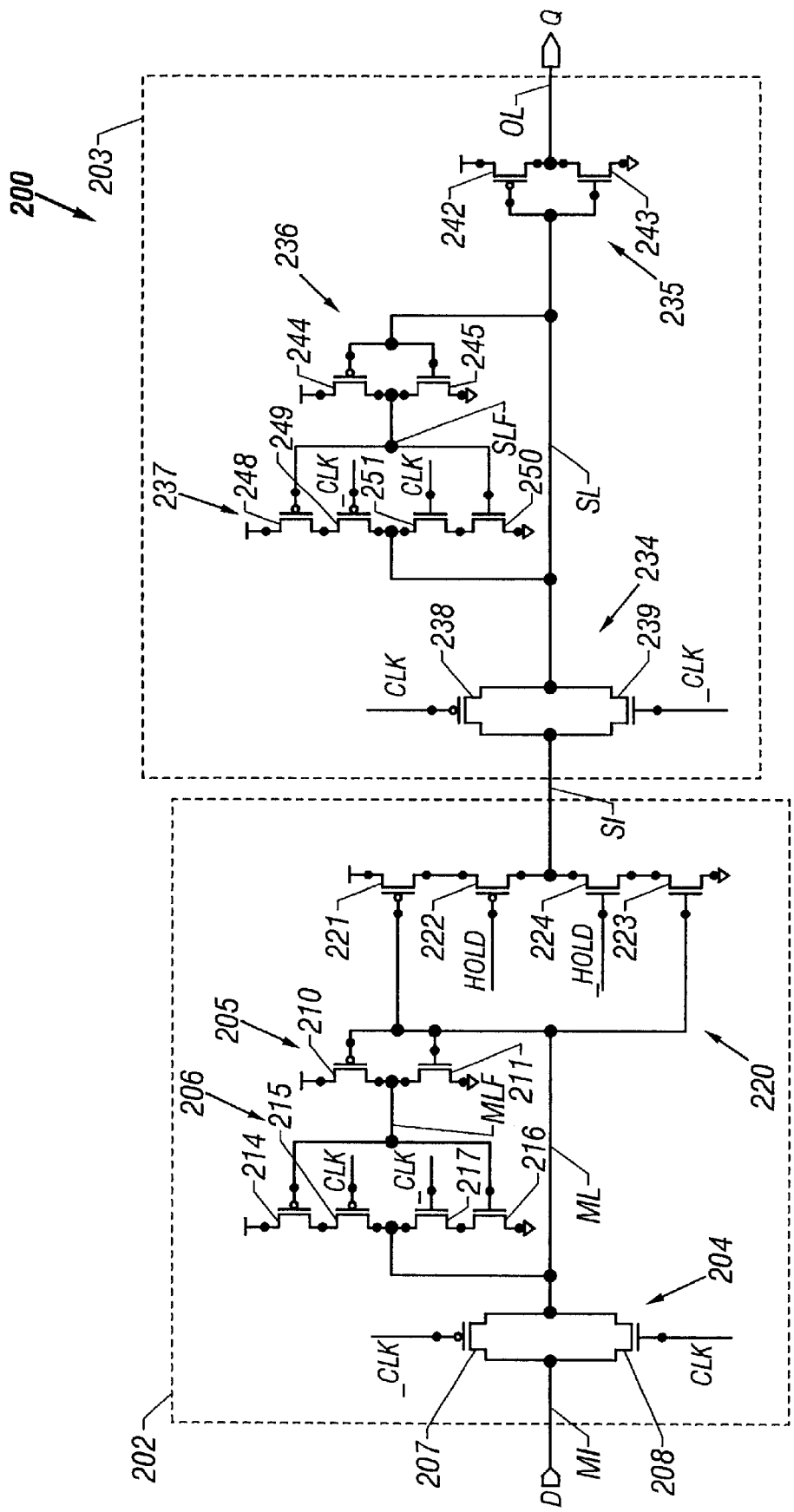
FIG. 2 is an electrical schematic diagram showing a master-slave flip-flop circuit by embodying the principles of the present invention.

As shown in FIG. 2, a master-slave flip-flop circuit 200 according to the invention includes a master latch circuit shown in dashed box 202 and a slave latch circuit shown in dashed box 203. Master-slave flip-flop circuit 200 operates on a clock input made up of clock signal CLK and the complementary signal __CLK. It will be appreciated that the complementary signal __CLK is produced by inverting clock signal CLK with a suitable inverting circuit which is not shown in the drawing. Master-slave flip-flop circuit 200 also receives hold signals HOLD and its complementary signal __HOLD. The latter signal "__HOLD" is produced by inverting the HOLD signal by a suitable inverter circuit which is also not shown in the drawings. As will be described further below, a high logical level HOLD signal and complementary low logical level __HOLD signal represents a hold input to master-slave flip-flop circuit 200.

The values of the logical signal levels used by master-slave flip-flop circuit 200 will depend upon the transistor devices used to implement the circuit. The invention is neither limited to any particular high logical level or range, nor limited to any low logical level or range. It will also be appreciated that the data which is latched in the master-slave flip-flop circuit 200 is a binary value represented by either a high level logical signal or a low level logical signal.

Master latch circuit 202 includes an input transmission gate 204, a master feedback inverter 205, and a master feedback control circuit 206. Master input transmission gate 204 is made up of P-type device 207 and N-type device 208 and is connected between a master latch node ML and a master input node MI which receives input data D to the circuit. Signal CLK is applied to the gate of device 208 while the complementary signal __CLK is applied to the gate of device 207. Master feedback inverter 205 has its input connected to master latch node ML and its output connected to a master feedback node MLF, and is made up of P-type device 210 and N-type device 211. Master feedback control circuit 206 comprises a tri-state inverter made up P-type devices 214 and 215 and N-type devices 216 and 217. The input of tri-state inverter 206 comprises the signal at master feedback node MLF and is applied to the gates of devices 214 and 216. Signal CLK and its complementary signal __CLK are applied to devices 215 and 217 respectively to selectively enable or disable tri-state inverter 206.

Master latch circuit 202 also includes a hold control component 220 connected between master latch node ML and a slave input node SI from which slave latch circuit 203 takes its input data. In the illustrated preferred form of the invention, hold control component 220 comprises a tri-state inverter made up of P-type devices 221 and 222 and N-type devices 223 and 224. Device 222 may be referred to as a first hold control device while device 224 may be referred to as a second hold control device. The input to this tri-state inverter 220 is taken from master latch node ML and is applied to devices 221 and 223. The signals HOLD and its complementary signal __HOLD are applied to the first and second hold control devices, 222 and 224 respectively, to selectively enable or disable tri-state inverter 220.

Slave latch circuit 203 shown in FIG. 2 includes a slave input transmission gate 234, an output inverter 235, a feedback inverter 236, and a feedback control circuit 237. Slave input transmission gate 234 is connected between slave input node SI and a slave latch node SL and includes P-type device 238 and N-type device 239. The clock signal CLK is applied to the gate of device 238 while the inverted clock signal __CLK is applied to the gate of device 239. It will be noted that these clock signals are reversed with respect to the clock signals applied to transmission gate 204 associated with master latch circuit 202.

Output inverter 235 takes its input from slave latch node SL and applies its output to output node OL for the master-slave flip-flop circuit 200 to produce the output data signal Q. This inverter is made up of P-type device 242 and N-type device 243. Slave feedback inverter 236 is made up of P-type device 244 and N-type device 245, and takes its input from slave latch node SL while applying its output to a slave feedback node SLF. Slave feedback control component 237 in the preferred form of the invention comprises a tri-state inverter circuit made up of P-type devices 248 and 249, and N-type devices 250 and 251. The input to tri-state inverter 237 is applied from slave feedback node SLF to the gates of devices 248 and 250 while devices 249 and 251 receive the inverted clock signal _CLK and clock signal CLK, respectively, to selectively enable or disable the circuit. Again it will be noted that the clock signals applied to the slave feedback control circuit 237 are reversed with respect to the clock signals applied to the master feedback control circuit 206.

Figure 3:
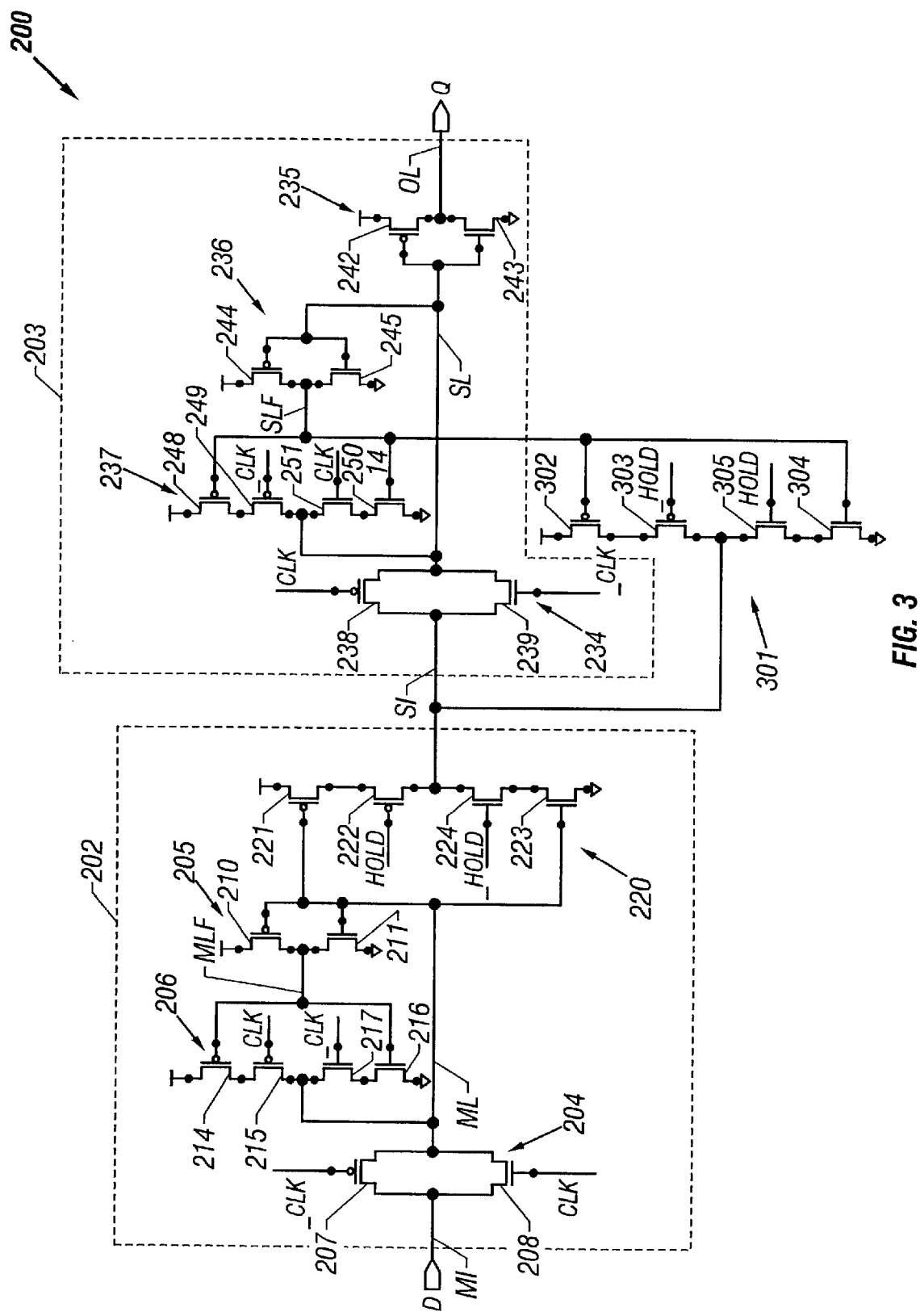
FIG. 3 is an electrical schematic diagram showing an alternate form of the master-slave flip-flop circuit according to the present invention.

FIG. 3 shows an alternate master-slave flip-flop circuit 200' embodying the principles of invention. This alternate form of invention is similar to that shown in FIG. 2 and includes slave latch circuit 203 and master latch circuit 202 having the hold control component 220. However, in contrast to the form of the invention shown in FIG. 2, the embodiment shown in FIG. 3 also includes a hold feedback component 301 connected between slave feedback node SLF and slave input node SI. Hold feedback component 301 is included in this alternate form of the invention to provide a continuous hold feedback signal to slave input mode SI as long as the hold input is asserted. This hold feedback maintains the state of node SI as will be discussed below with reference to FIG. 4. The preferred hold feedback component 301 shown in FIG. 3 comprises a tri-state inverter made up of P-type devices 302 and 303 and N-type devices 304 and 305. The input to tri-state inverter 301 comprises the signal at slave feedback node SLF and is applied to the gates of devices 302 and 304. Devices 305 and 303 represent first and second hold feedback control devices, respectively. First hold feedback control device 305 receives the HOLD signal at its gate while second hold feedback control device 303 receives the _HOLD signal at its gate to selectively enable and disable tri-state inverter 301.

Master-slave flip-flop circuits 200 and 200' represent only preferred forms of the invention. Many variations in these circuits are possible within the scope of the invention as defined in the following claims. For example, the invention is not limited to the transmission gates 204 and 234 used to pass data to the respective latch node. Other forms of the invention may utilize single transistor pass gates for controlling when data is passed from the respective input node to the respective latch node.

Figure 4:
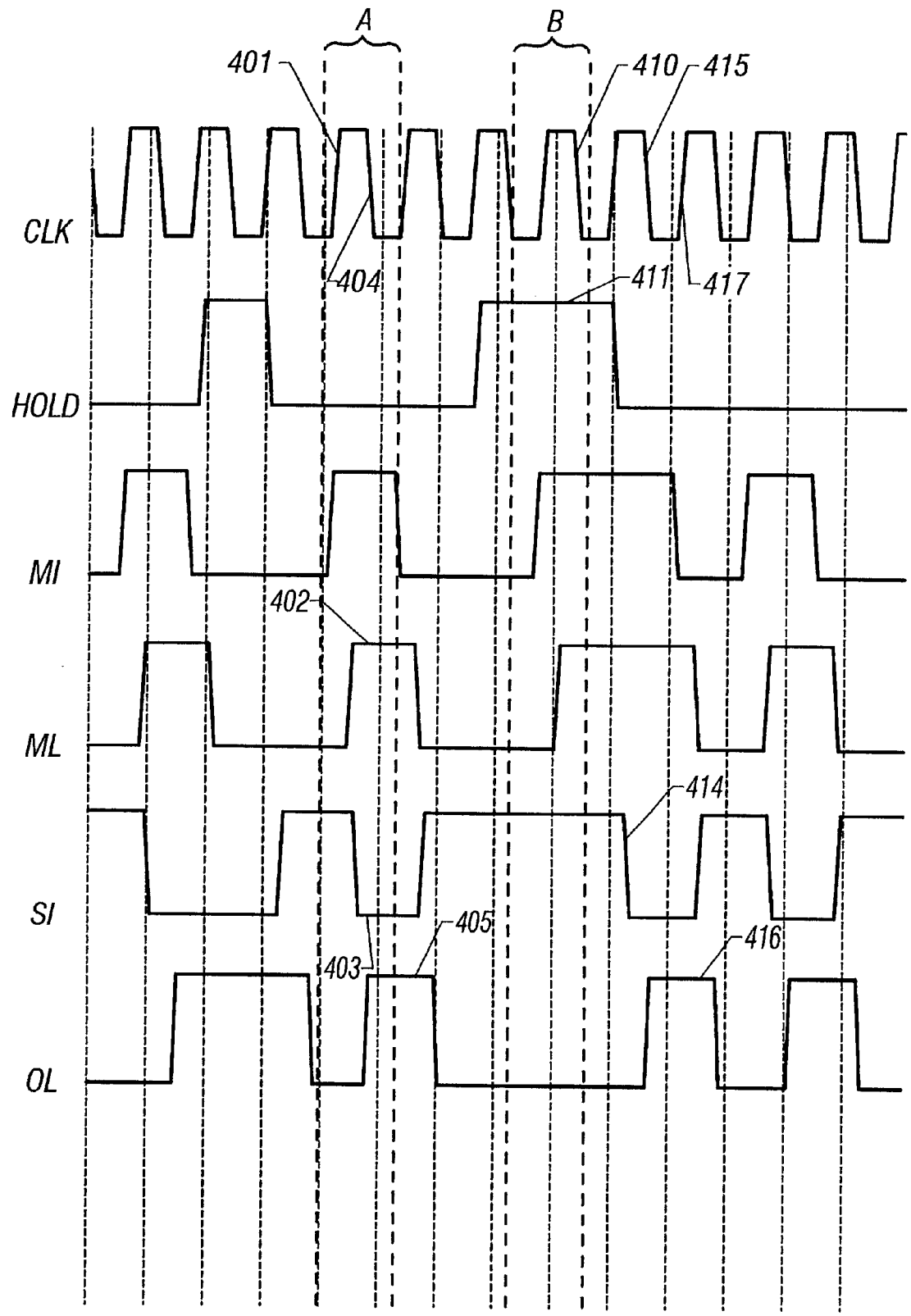
FIG. 4 is a timing chart showing timing relationships in the circuits shown in FIGS. 2 and 3.

The operation of master-slave flip-flop circuits 200 and 200' according to the invention may be described with reference to the circuit diagrams of FIGS. 2 and 3, and to the timing chart shown in FIG. 4. In particular, FIG. 4 shows the state of master latch node ML, slave input node SI, and master-slave flip-flop output node OL, in response to data at input node MI, the clock signal CLK and hold signal HOLD. It will be appreciated that the inverted or complementary forms of signals CLK and HOLD are also applied to the circuits as indicated in the circuit diagrams but are eliminated from FIG. 4 in order to simplify the figure.

The normal operation of master-slave flip-flop circuit 200 and 200', that is, the operation without the hold input asserted, may be described with reference to the portion of time shown at area A of FIG. 4. When the hold input is not asserted, the signal HOLD is at its logical low state and _HOLD is at its logical high state. The low HOLD signal and high_HOLD signal make devices 222 and 224 conductive in the hold control component 220 shown in FIGS. 2 and 3. When the clock signal CLK goes high as shown at 401 in FIG. 4, devices 207 and 208 of master input transmission gate 204 become conductive and the high level data signal at node MI passes to master latch node ML through the master input transmission gate to result in the high level signal at the master latch node as shown at 402 in FIG. 4. Since the low HOLD and high _HOLD signals place devices 222 and 224 in their respective conductive state at this time, the tri-state inverter comprising hold control component 220 is enabled to invert the signal at master latch node ML and apply the inverted signal to slave input node SI as shown at 403. During the time that clock signal CLK is high, devices 238 and 239 of slave transmission gate 234 are nonconductive to prevent data from being transferred from slave input node SI to slave latch node SL. Also, the high CLK signal and its low level complement make devices 215 and 217 nonconductive, placing tri-state inverter 206 in its disabled or tri-stated condition effectively blocking the feedback through master feedback node MLF to master latch node ML.

As clock signal CLK goes low as shown at 404 in FIG. 4, devices 238 and 239 of slave input transmission gate 234 become conductive to the pass the signal appearing at slave input node SI to slave latch node SL. The signal at slave latch node SL is inverted at output inverter 235 and applied to output node OL of the master-slave flip flop circuit as shown at 405 in FIG. 4. At the same time the clock signals CLK and_CLK place devices 207 and 208 in their nonconductive state to disable master input transmission gate 204. It will be noted that as the data passes onto slave latch node SL, slave feedback control circuit 237 is disabled since the low CLK signal places device 251 in a nonconductive state and the high _CLK signal places device 249 also in a nonconductive state. Also, the low CLK and high _CLK signals make devices 215 and 217 conductive in master feedback control circuit 206, causing the circuit to apply the feedback signal to master latch node ML and maintain the charge state of the master latch node.

It will be noted that the operation of master-slave flip-flop circuit 200' is identical to circuit 200 in the normal operation when the hold input is not asserted since hold feedback circuit 301 is disabled or tri-stated by the low level HOLD signal and high level _HOLD signal. That is, the high level _HOLD signal places device 303 in a nonconductive state and the low level HOLD signal places device 305 in a nonconductive state. This prevents any feedback signal from being applied to slave input node SI through hold feedback circuit 301 in FIG. 3.

The hold input or control input according to the invention for the illustrated circuits comprises a high level HOLD signal and a low level _HOLD signal. When the HOLD signal goes high, the signal places device 222 in a nonconductive state and the low level_HOLD signal places device 224 in a nonconductive state to disable or tri-state hold control component 220. Disabling hold control component 220 effectively prevents the signal at master latch node ML from being inverted and transferred to slave input node SI. Thus, slave input node SI remains at its previous level regardless of any change in data read into master latch circuit 202.

Referring to the area of time B in FIG. 4, as clock signal CLK goes low at 410 with the HOLD signal in a high level state as indicated at 411, the signal at slave input node SI remains substantially unaffected by the state of master latch node ML, and thus the signal at the circuit output OL holds at the level present at the time the hold input was asserted by applying the high level HOLD signal and low level _HOLD signal. However, when the HOLD signal goes low, master-slave flip-flop circuit 200 or 200' returns to its normal state of operation as described with reference to time area A of FIG. 4. The low level HOLD signal makes device 222 conductive and the high level _HOLD signal makes device 224 conductive, thereby enabling the tri-state inverter comprising hold control component 220. Thus, the slave input node SI immediately receives the data at master latch node ML as inverted through hold control component 220. This transfer of data is shown in FIG. 4 at 414. When clock signal CLK then goes low at 415, slave input transmission gate 234 is enabled to pass the data at slave input node SI to slave latch node SL and the signal is inverted through output inverter 235 to produce the output data signal at node OL as shown at 416 in FIG. 4. This data is then stored in slave latch 203 when the clock CLK goes high at 417.

In circuit 200 shown in FIG. 2, the slave input node SI is refreshed from the voltage state at slave latch node SL each time the clock signal CLK goes to a low level since that condition activates or enables slave input transmission gate 234 to couple the slave input node to the slave latch node. In the form of the invention shown in FIG. 3, when the hold input is asserted and thus the HOLD signal is at a high level and the_HOLD signal is at a low level, hold feedback component 301 is enabled to apply a feedback signal to slave input node SI. The hold feedback is produced by inverting the signal at slave latch node SL through slave feedback inverter 236 and then inverting the signal again through the tri-state inverter comprising hold feedback component 301. This feedback to slave input node SI is continuous as long as the hold input is asserted.

The above described preferred embodiments are intended to illustrate the principles of the invention, but not to limit the scope of the invention. Various other embodiments and modifications to these preferred embodiments may be made by those skilled in the art without departing from the scope of the following claims. For example, it is possible to reverse the connections to the clock signals CLK and _CLK between the master and slave latch circuits so that the operation of the circuits is reversed with respect to the operation described with reference to FIG. 4. Also, the invention is not limited to the CMOS implementation shown in the figures or to the illustrated control circuits and transmission gates.

What is claimed is:

1. A master-slave flip-flop circuit including:
   (a) a master latch circuit having a master latch node and being operable in response to a clock input;
   (b) a slave latch circuit having a slave input node and being operable in response to the clock input; and
   (c) a hold control component connected between the master latch node and the slave input node and also connected to receive a hold input distinct from the clock input, the hold component for blocking the transfer of data from the master latch node to the slave input node in response to the hold input.

2. The master-slave flip-flop circuit of claim 1 wherein the hold component comprises a hold control tri-state circuit having an input connected to the master latch node and an output connected to the slave input node, and wherein the hold input disables the hold control tri-state circuit.

3. The master-slave flip-flop circuit of claim 2 wherein the hold component comprises a tri-state inverter having a first hold control device connected to receive a hold signal, and also having a second hold control device connected to receive an inverted hold signal.

4. The master-slave flip-flop circuit of claim 3 wherein the master latch circuit includes:

(a) a master input transmission gate connected between a master input node and the master latch node;
(b) a master feedback inverter connected between the master latch node and a master feedback node; and
(c) a master feedback control component connected between the master feedback node and master latch node.

5. The master-slave flip-flop circuit of claim 4 wherein the slave latch circuit includes:
   (a) a slave input transmission gate connected between the slave input node and a slave latch node;
   (b) a slave feedback inverter connected between the slave latch node and a slave feedback node;
   (c) a slave feedback control component connected between the slave feedback node and the slave latch node; and
   (d) a slave output inverter connected between the slave latch node and a slave output node.

6. The master-slave flip-flop circuit of claim 1 further including a hold feedback component connected to the slave input node for applying feedback to the slave input node based upon the state of a slave latch node included in the slave latch circuit.

7. The master-slave flip-flop circuit of claim 6 wherein the hold feedback component comprises a hold feedback tri-state circuit having an input connected to a slave feedback node of the slave latch circuit and an output connected to the slave input node, and wherein the hold input enables the hold feedback tri-state circuit.

8. The master-slave flip-flop circuit of claim 7 wherein the hold feedback component comprises a hold feedback control tri-state inverter having a first hold feedback control device connected to receive a hold signal, and also having a second hold feedback control device connected to receive an inverted hold signal.

9. The master-slave flip-flop circuit of claim 8 wherein the hold control component comprises a hold control tri-state inverter having an input connected to the master latch node and an output connected to the slave input node, the hold control tri-state inverter also having a first hold control device connected to receive the hold signal, and a second hold control device connected to receive the inverted hold signal.

10. A master-slave flip-flop circuit including:
    (a) a master latch circuit having a master latch node;
    (b) a slave latch circuit having a slave input node; and
    (c) a tri-state hold control circuit including a control input, an input connected to the master latch node, and an output connected to the slave input, the control input being connected to receive a hold input which disables the tri-state hold control component.

11. The master-slave flip-flop circuit of claim 10 wherein the tri-state hold circuit includes a first hold control device connected to receive a hold signal, and further includes a second hold control device connected to receive an inverted hold signal.

12. The master-slave circuit of claim 11 wherein the tri-state hold control circuit comprises a tri-state inverter.

13. The master-slave flip-flop circuit of claim 12 includes a tri-state hold feedback circuit connected to apply a hold feedback signal to the slave input node when the hold input is asserted.

14. The master-slave flip-flop circuit of claim 13 wherein the slave latch circuit includes a slave feedback inverter connected between a slave latch node and a slave feedback node of the slave latch circuit and wherein the tri-state hold feedback circuit comprises a tri-state inverter having an input connected to the slave feedback node, an output connected to the slave input node, and a control input connected to receive the hold signal and inverted hold signal.

15. A method of holding data in a master-slave flip-flop circuit including a master latch circuit connected to supply data to a slave latch circuit, the method including the steps of:

(a) in response to a first clock signal, applying data from a master latch node included in the master latch circuit to a slave input node included in the slave latch circuit, and then latching the data at the slave latch circuit; and (b) applying a hold input to isolate the slave input node from the master latch node in a following clock cycle, the hold input being distinct from the first clock signal.

16. The method of claim 15 wherein the master latch circuit includes a tri-state hold control circuit, and wherein the step of applying the hold input includes:

(a) applying a hold signal to a first hold device; and (b) applying an inverted hold signal to a second hold device.

17. The method of claim 15 further including the step of applying a hold feedback signal to the slave input node in response to the hold input.

18. The method of claim 17 further including a hold feedback control tri-state circuit, and the step of applying the hold feedback signal to the slave input includes:

(a) applying a hold signal and an inverted hold signal to place the hold feedback control tri-state circuit in an enabled condition.

19. The method of claim 18 wherein the hold feedback tri-state circuit comprises a hold feedback control tri-state inverter and the slave latch circuit includes a slave feedback node, and wherein the step of applying the hold feedback signal includes applying a signal at the slave feedback node to an input of the tri-state inverter.

20. The method of claim 15 wherein the master-slave flip-flop circuit further includes a hold feedback control tri-state circuit connected to apply a feedback signal for the slave latch circuit in response to the hold input, and wherein the master latch circuit includes a tri-state hold control circuit, and wherein the step of applying the hold input includes:

(a) applying a hold signal to a first hold control device included in the hold control tri-state circuit;

(b) applying an inverted hold signal to a second hold control device included in the hold control tri-state circuit;

(c) applying the hold signal to a first hold feedback control device included in the hold feedback control tri-state circuit; and (d) applying the inverted hold signal to a second hold feedback control device included in the hold feedback control tri-state circuit.

* * * * *